United States Patent [19]

Moll et al.

[11] Patent Number: 4,598,663
[45] Date of Patent: Jul. 8, 1986

[54] APPARATUS FOR TREATING THE INSIDE SURFACE OF AN ARTICLE WITH AN ELECTRIC GLOW DISCHARGE

[75] Inventors: Eberhard Moll, Triesen, Liechtenstein; Rainer Buhl, Sargans, Switzerland

[73] Assignee: Balzers Aktiengesellschaft, Liechtenstein

[21] Appl. No.: 608,971

[22] Filed: May 10, 1984

[30] Foreign Application Priority Data

May 10, 1983 [CH] Switzerland ................. 2544/83

[51] Int. Cl.⁴ ............................................... S05D 3/14
[52] U.S. Cl. .................... 118/50.1; 118/723; 118/724
[58] Field of Search ............... 118/50.1, 723, 724

[56] References Cited

U.S. PATENT DOCUMENTS

| 4,262,035 | 4/1981 | Jaeger et al. | 427/238 |
| 4,349,582 | 9/1982 | Beerwald | 427/238 |
| 4,418,645 | 12/1983 | Knights | 118/723 X |
| 4,508,748 | 4/1985 | Eriksson | 427/238 X |

*Primary Examiner*—Bernard D. Pianalto
*Attorney, Agent, or Firm*—McGlew and Tuttle

[57] ABSTRACT

To be able to treat the inside surface of metallic tubes by means of an electric glow discharge at pressures lower than heretofore in order to heat or coat such a surface, for example, an auxiliary electrode is positioned inside an article to be treated such as a tube extending close to the tube wall and parallel to the tube axis, with the auxiliary electrode and the tube being rotatable relative to each other. The apparatus and method are primarily for coating the inside of tubes.

9 Claims, 3 Drawing Figures

APPARATUS FOR TREATING THE INSIDE SURFACE OF AN ARTICLE WITH AN ELECTRIC GLOW DISCHARGE

FIELD AND BACKGROUND OF THE INVENTION

This invention relates in general to electric glow discharge devices and methods for treating metallic tubes and in particular to a new and useful device particularly for treating the inside of a tube which includes a vacuum chamber having a cathode mounted within the tubular article to be treated in a vacuum chamber so that the cathode and the article are rotatable relative to each other and to an improved method of treating the article.

Such an apparatus for treating the interior of a tube using an electric glow discharge is known from German Pat. No. 976,529. This prior art apparatus is not suitable for depositing by cathode sputtering on the inside surface of a tube a sufficiently adherent and dense layer of electrode material, since the atoms knocked out of the auxiliary electrode lose a major portion of their kinetic energy by colliding with the gas atoms and molecules prior to reaching the surface to be coated. This energy, however, would be well utilized upon impinging on the inside of the tube, for displacing or dislodging the gas atoms or molecules there sorbed, and thus for building up a firmly adhering and dense layer. An apparatus of this kind, as far as usable for producing high quality layers, has substantial advantages over other prior art devices for the inside coating of tubes, such as described, for example in the following disclosures: German No. AS 2,820,301 German No. OS 2,544,942; German No. OS 2,729,286; Publication J. L. Vossen and W. Kern, "Thin Film Processes", Academic Press, 1978.

Devices of this kind require magnetic fields or high-frequency alternating fields and are therefore expensive and complicated, in both manufacture and operation. Greatest difficulties arise if ferromagnetic tubes are to be coated, since in such an event, magnetic fields are varied in a manner suppressing an effective gas ionization. Another problem arises while attempting reactive sputtering of the auxiliary electrode introduced into the tube. Since in this case, the reactive gas is incorporated into the connecting layer, thus consumed, the reactive gas component in the central zone between the open tube ends is depleted, particularly in instances where the sputtering equipment occupies most of the space inside the tube to be coated. A gas distributor such as disclosed in British Pat. No. 1,570,044 cannot be employed for an inside coating of narrow tubes.

SUMMARY OF THE INVENTION

The present invention is directed to an improvement of an interior electron sputtering apparatus, making it suitable for treating the inside surfaces of tubes in various ways, primarily for depositing thin, uniform, well adhering, and dense layers, for example preliminary heat treatment by cathodic etching of the inside surface and subsequent coating thereof by cathode sputtering. At the same time, magnetic fields, high-frequency alternating fields, and high flow resistances, such as indispensible in many prior art methods, are avoided.

In accordance with the invention, an apparatus for treating the inside surface of an article such as a tube by means of an electric glow discharge comprises a vacuum chamber which has a hollow cathode positioned so that it may be supported within the tube to be treated and with means for rotating the article and the cathode tube relatively within the vaccum chamber.

In contradistinction to the prior art device of the above mentioned German Pat. No. 976,529, the inventive device makes it possible to obtain the hollow cathode effect at a lower gas pressure. At the same time, since the distance between the auxiliary electrode and the inside surface of the tube is reduced, the collisions between the gas atoms and the atoms knocked out of the auxiliary electrode and being on their way to the inside of the tube, become less frequent. This results in surprisingly well adhering and very dense, fine-grained layers. During the coating, a relative movement between the tube and the auxiliary electrode is advantageous, to make the layers more uniform.

Surprisingly, and in contradistinction to the prior art arrangement, a satisfactory hollow cathode effect can be obtained with the inventive arrangement even in instances where the anode potential, or a floating potential, is applied to the auxiliary electrode so that this electrode is not subjected to sputtering. For this purpose, it is not necessary to withdraw it from the tube. The invention thus makes possible the coating process in two phases, namely a first phase during which the surface to be coated is etched by cathode sputtering, and a second phase during which the same surface is coated by cathode sputtering of the auxiliary electrode. Such a first phase of etching makes the coat particularly well adhering to the underlying structure, since the material knocked out of the tube wall deposits on the auxiliary electrode and is later, mixed with the material of the auxiliary electrode, during the second phase, sputtered and deposited on the inside of the tube again. In this way, a continuous transition between the tube material and the electrode material is obtained, which may be considered the cause of the firm adhesion.

The inventive device, however, is suitable also for other preliminary treatment in an electric gas discharge, not only for etching and subsequent coating of the inside surface. For example, it may be useful to heat the inside of the tube prior to coating by means of an electric gas discharge, with the tube wall being connected as cathode, in the same way as during the etching and coating phases. In this event of heating only, the use of helium as the discharge gas has proved particularly satisfactory, since helium produces a smaller sputtering effect than heavy gases, so that pure heating is possible, without etching the tube wall before the coating.

In accordance with the method of the invention, the vacuum chamber is advantageously connected to a pump for evacuating the chamber to a gas inlet for admitting selective gases such as helium and argon. The chamber is provided with a mounting for a tubular article to be treated and located so that it is within a substantially U-shaped cathode in the form of a hollow tube. The cathode is arranged so that it is spaced from the interior wall of the article to be treated and the cathode and tube may be rotated relative to each other. Preferably the cathode auxiliarly electrode is made of titanium and comprises a U-shaped hollow tube having two substantially parallel leg portions which extend parallel to and are spaced from the interior wall of the tube. With the inventive method the tube is coated with a pulverant TiN and advantageously using a plasma spray method, the tube is covered with the pulverant TiN. The coated tube is then placed in the evacuated chamber after the tubular article to be coated is arranged therein and helium is introduced into the chamber. A negative voltage is applied to the article to heat the article advantageously to a temperature of 400° C. The helium is evacuated and replaced with argon. A voltage is then applied and after five a negative voltage is applied to the auxiliary electrode and sputtering TiN powder is effected. Advantageously a voltage between the auxiliary electrode and the anode is at least one and a half times higher than the voltage between the article to be treated and the anode.

Accordingly, it is an object of the invention to provide an apparatus for treating the inside surface of a tube by means of an electric glow discharge while utilizing a hollow cathode effect for producing a glow discharge which is concentrated on the interior wall of the tube and which comprises a vacuum chamber having an anode and an auxiliary electrode held in place within the vacuum chamber which is disposed inside the surface of the article to be treated and spaced away from the axis of the article to be treated.

A further object of the invention is to provide an improved apparatus for treating a tubular article which comprises a vacuum chamber having a U-shaped cathode which is arrangeable within a tubular article in a spaced location from the wall of the article and from the axis of the article which includes means for rotating the cathode and the tube relatively.

A further object of the invention is to provide a method for coating a metal tube which comprises arranging the tube in a vacuum chamber within a U-shaped cathode such that the tube and the cathode may be rotated relatively and by providing selective means for applying a voltage between the cathode and the anode and between the anode and the article.

A further object of the invention is to provide a device for treating articles which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
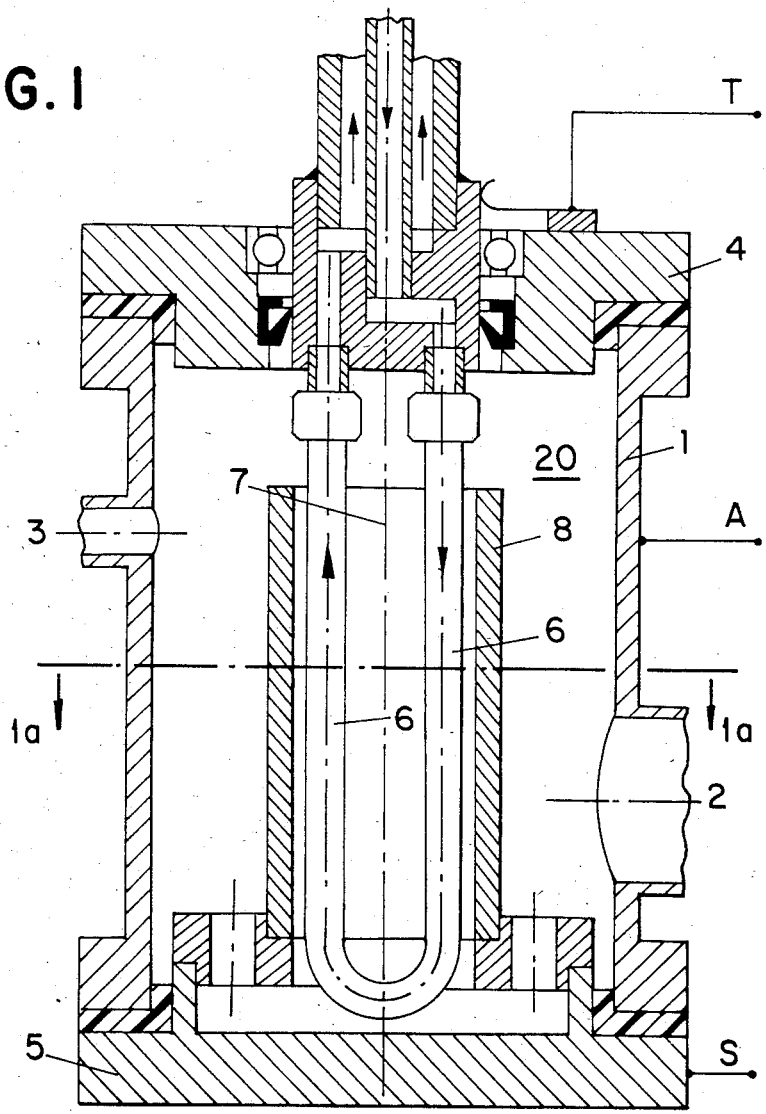
FIG. 1 is a longitudinal sectional view of a preferred embodiment of the invention.

Referring to the drawings in particular, the invention embodied therein comprises an apparatus for treating the inside surface of an article such as a tube 8 by means of a glow discharge produced by applying a voltage between an auxiliary electrode forming a cathode and an anode comprising a housing 1 so as to produce a glow discharge which is concentrated on the inner surface of the tubular article 8. The housing 1 defines a vacuum chamber 20 with an anode and an auxiliary electrode 6 which is held in place within the vacuum chamber 20. The auxiliary electrode 6 is disposed inside the tube 8 and spaced from its interior surface and from the axis of rotation of the tube 8 and includes a U-shaped configuration with the legs being spaced from the axis and the interior of the wall of the article.

Figure 1A:
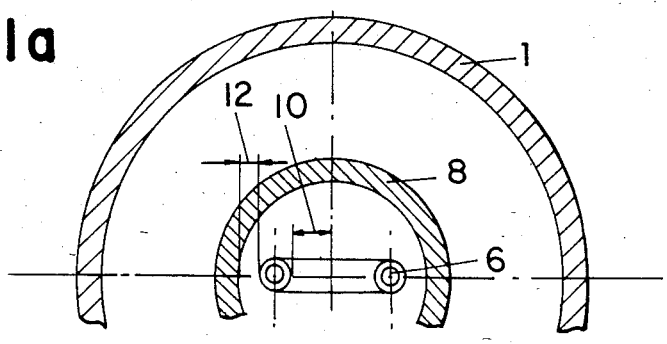
FIG. 1a is a section taken along the line 1a—1a of FIG. 1.
Figure 2:
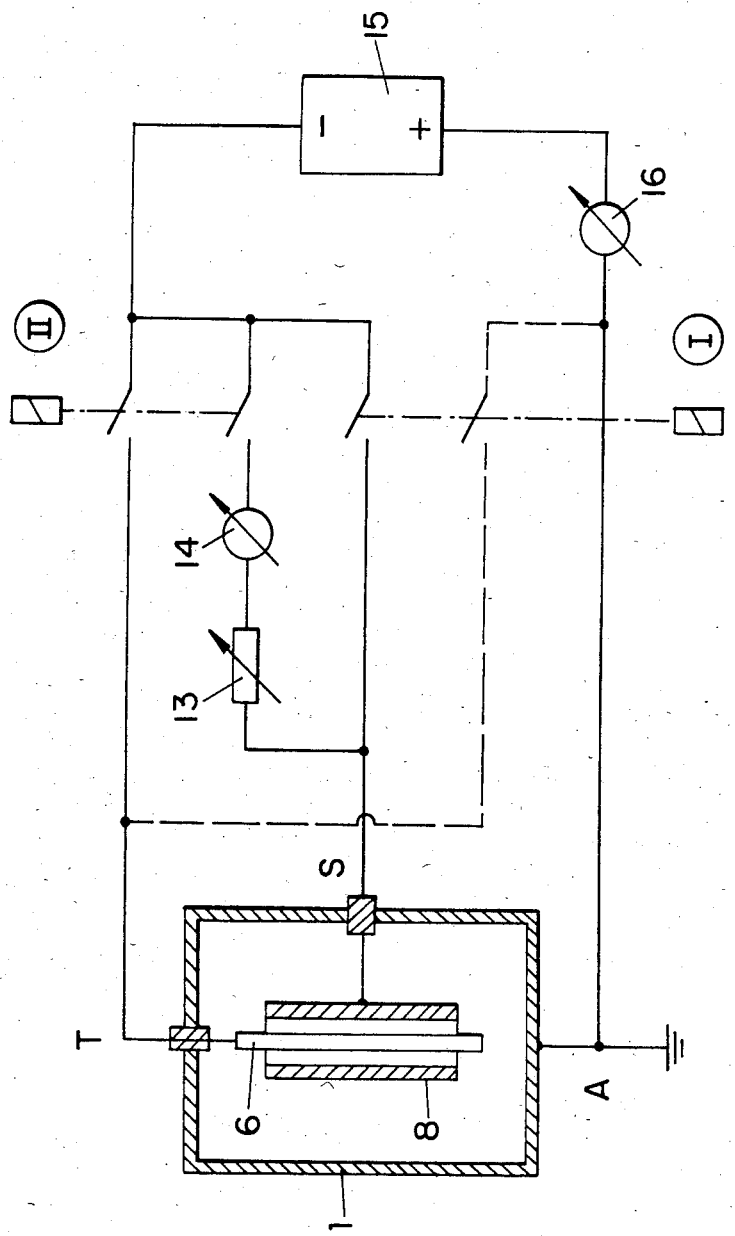
FIG. 2 is a schematic electrical circuit for the switching alternatives "etching by sputtering", and "coating".

The vacuum chamber 20 is bounded by a conductive cylindrical part of housing 1, having a pump cnnection 2, a gas inlet 3, a cover 4 and a bottom 5. In cover 4, tubular auxiliary electrode 6 comprising a hollow body, is mounted for rotation about axis 7. Along with the tube 8 to be treated, auxiliary electrode 6 bounds a twice continuous space, which is particularly seen in the cross section, FIG. 1a. In the zone of the inside surface of tube 8 to be treated, auxiliary electrode 6 should be spaced from the tube axis 7 by a distance 10 as large as possible, to obtain in the zone of axis 7 a free space. Gap 12 is advantageously minimized; its width is limited by the manufacturing tolerances and the requirement of avoiding any contact between the auxliliary electrode and the tube wall. To simplify the illustration, cover 4 and bottom 5 are shown in FIG. 1 as having applied electric potentials T and S different from those applied to the walls of vacuum chamber 1, so that they also serve as vacuum-tight connections for applying the voltage. Bottom 5 acts as support means for the tube 8. In practice, of course, these parts must be protected against accidental contact. Auxiliary electode 6 is cooled by a coolant circulated therethrough and is insulated against vacuum chamber wall and connected through an electrical potential of line T to an electrical circuit, as shown in FIG. 2. Tube 8 to be coated is also electrically insulated against the vacuum chamber wall and connected through an electrical potential or line S to the same circuit.

This circuit shown in FIG. 2, establishes the connection "etching" if switch I is closed, and the connection "coating" if switch II is closed.

With the first connection for "etching", a positive or floating potential relative to the tube wall is applied to the auxiliary electrode. With the second connection for "coating" the same or a higher potential relative to the tube wall is applied to the auxiliary electrode 6 which in this case forms with the tube wall a hollow cathode. Connections T, S and A of FIG. 2 correspond to the showing of FIG. 1. Variable resistor 13 and measuring instrument 14 serve the purpose of adjusting and monitoring the power distribution between the auxiliary electrode and the tube during the sputtering operation, measuring device 16 measures the total discharge current.

It may be useful sometimes, in a manner known per se, to use high-frequency fields for assisting the treatment in an inventive apparatus. To this end, for example, another additional auxiliary electrode, electrically insulated against the first one, may be provided forming with the first auxiliary electrode a pair of high-frequency electrodes.

If U-shaped electrodes are employed for this purpose, similar to the auxiliary electrode 6 shown in FIG. 1, a kind of quadruple arrangement is obtained. The process may also be assisted by a suitable magnetic field, provided that the tube to be coated is non-magnetizable. Advantages provided by helps of this kind superimpose each other, so that they also add to the advantages of the invention.

The following example may be instrumental in showing the technological advance obtained with the invention.

A steel tube having a length of 550 cm and an inside diameter of 40 cm is to be coated on its inside width TiN. The auxiliary electrode 6 of a titanium tube having an outside diameter of 6 mm is bent to a U, so as to obtain a clearance of 26 mm between the two legs. In a manner known per se, this titanium tube is then coated with pulverulent TiN while using a so-called plasma spray method, to obtain a coating layer thickness of about 0.3 mm. Upon placing this electrode in the apparatus according to FIG. 1 and pumping the air out, helium is introduced up to a pressure of 0.4 millibar, and switch I is actuated to apply a negative voltage to the tube 8, which is gradually increased from 300 to 900 volt. Upon reaching a temperature of 400° C., the helium is evacuated and replaced by argon, and the voltage source is switched on again. After about five minutes, switch II is closed, instead of switch I. Now, the negative pole of the voltage source is applied to the auxiliary electrode 6, and the sprayed TiN powder is sputtered first. Variable resistor 13 is adjusted to obtain, with a voltage of 570 volts and a total amperage of 3.1 A, a voltage of 300 V on the tube, and to read 1.1 A on ampermeter. After three hours, a 3.4 microns thick layer has deposited on the inside of the tube, having a Vickers hardness of 2,600 and a golden color characteristic of TiN.

While specific embodiments of the invention have been shown and described in detail to illustrate the application of the principles of the invention, it will be understood that the invention may be embodied otherwise without departing from such principles.

What is claimed is:

1. An apparatus for treating the inside surface of an electrically conductive article such a tubular article by means of an electric glow discharge utilizing a hollow cathode effect for producing a glow discharge, comprising:

(a) a housing defining a vacuum chamber including a cylindrical portion, a first cover connected to and electrically insulated from said cylindrical portion and forming a support for supporting the tubular article and a second cover connected to and electrically insulated from said cylindrical portion and having at least a part bounding the chamber which may be electrically conductive;

(b) an electrically conductive fluid cooled auxiliary electrode located to extend within the vacuum chamber said electrically conductive auxiliary electrode being in the form of a U-shaped hollow tube having a first leg and a second leg and said auxiliary electrode including passages for supplyingcoolant whereby, coolant is directed into the first leg of the U-shaped hollow tube flows through the U-shaped hollow tube and exits the second leg of the U-shaped hollow tube;

(c) electrically conductive support means, connected to and in electrical contact with said second cover, for supporting the electrically conductive tubular article in the vacuum chamber for creating an electrical contact with the tubular article, the article having a central axis and an interior wall, and for supporting the tubular article so that said auxiliary electrode extends into the article so that said first leg and said second leg of said auxiliary electrode are positioned near to but spaced from the interior wall and spaced from the central axis the electrical contact with said electrically conductive support means forming an anode electrode; and, (d) circuit means electrically connected to said electrically conductive chamber said auxiliary electrode and said support means for applying potential thereto to form an electric glow discharge mainly between the inner wall of the electrically conductive tubular article and said auxiliary electrode in the interior of the electrically conductive tubular article.

2. An apparatus according to claim 1, including means supporting said auxiliary electrode and said article so that they are rotatable relative to each other about the axis of said article.

3. An apparatus according to claim 1, wherein said auxiliary electrode comprises an elongated body having an interior coolant passage therethrough.

4. An apparatus according to claim 1, including two clamping elements in said chamber holding said auxiliary electrode so that it extends between and is parallel to the axis of said tubular article.

5. An apparatus according to claim 1, wherein said auxiliary electrode has at least a surface made of a material which is to be deposited on the surface of the tubular article by cathode sputtering.

6. An apparatus according to claim 1, wherein said circuit means is for applying an electrical potential to said auxiliary electrode which is higher than that of said article.

7. An apparatus according to claim 1, wherein said circuit means includes an electrical power circuit having a high voltage supply device with a negative and positive electrode and switch means for connecting and disconnecting said auxiliary electrode to said high voltage device and negative pole.

8. An apparatus according to claim 1, wherein said circuit means includes a source of electricity having a positive terminal and a negative terminal, a first switch which is closeable for connecting said negative terminal to said auxiliary electrode and to said electrically conductive support means for supporting the tubular article, and second switch means closeable for connecting said positive terminal to said auxiliary electrode, said positive terminal being connected directly to said anode electrode.

9. An apparatus for treating the inside surface of a tubular article, comprising wall means defining a vacuum chamber, a substantially U-shaped hollow auxiliary electrode mounted on said wall means and extending into said vacuum chamber, means associated with said wall means for rotatably supporting said auxiliary electrode, means for mounting a tubular article to be coated within said vacuum chamber so that its interior wall is near to but spaced from said U-shaped cathode and so that its axis is centered within said cathode, a high voltage power source connected to said cathode, to said wall means, and to said article, said connection including an electrical circuit having a variable resistance permitting variation of the voltage potential of said cathode in respect to said article.

* * * * *